United States Patent
Ikegami et al.

(10) Patent No.: US 9,524,764 B2
(45) Date of Patent: Dec. 20, 2016

(54) SEMICONDUCTOR DEVICE HAVING STACKED CHIPS

(71) Applicant: KABUSHIKI KAISHA TOSHIBA, Minato-ku, Tokyo (JP)

(72) Inventors: Kazutaka Ikegami, Kawasaki (JP); Keiko Abe, Yokohama (JP); Kumiko Nomura, Tokyo (JP); Hiroki Noguchi, Yokohama (JP); Shinobu Fujita, Inagi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 134 days.

(21) Appl. No.: 14/042,819

(22) Filed: Oct. 1, 2013

(65) Prior Publication Data

US 2014/0104920 A1   Apr. 17, 2014

(30) Foreign Application Priority Data

Oct. 11, 2012 (JP) .................................. 2012-226162

(51) Int. Cl.
G11C 5/02 (2006.01)
G11C 11/16 (2006.01)

(52) U.S. Cl.
CPC .............. G11C 11/16 (2013.01); G11C 5/025 (2013.01); G11C 11/165 (2013.01)

(58) Field of Classification Search
CPC ..... G11C 11/16; G11C 5/066; Y02B 60/1228; Y02B 60/1235
USPC .................. 365/66, 189.02, 230.02
See application file for complete search history.

(56) References Cited

U.S. PATENT DOCUMENTS

| | | | |
|---|---|---|---|
| 5,640,361 A * | 6/1997 | Hessel | 365/233.1 |
| 8,525,251 B2 | 9/2013 | Hagishima et al. | |
| 8,531,866 B2 | 9/2013 | Ikegami et al. | |
| 2005/0013153 A1* | 1/2005 | Perroni et al. | 365/100 |
| 2005/0105380 A1* | 5/2005 | Takahashi et al. | 365/233 |
| 2005/0265086 A1* | 12/2005 | Takano et al. | 365/189.05 |
| 2006/0126369 A1* | 6/2006 | Raghuram | 365/51 |
| 2010/0246152 A1* | 9/2010 | Lin et al. | 361/783 |
| 2011/0193086 A1* | 8/2011 | Lee et al. | 257/48 |

(Continued)

FOREIGN PATENT DOCUMENTS

| | | |
|---|---|---|
| JP | 2001-92771 | 4/2001 |
| JP | 2009-170459 | 7/2009 |

(Continued)

OTHER PUBLICATIONS

JEDEC Standard, "Wide I/O Single Data Rate (Wide I/O SDR)," JEDEC Standard JESD 229, JEDEC Solid State Technology Association, pp. 1-67, (Dec. 2011).

(Continued)

*Primary Examiner* — Khamdan Alrobaie
(74) *Attorney, Agent, or Firm* — Finnegan, Henderson, Farabow, Garrett & Dunner, LLP

(57) ABSTRACT

According to one embodiment, a semiconductor device includes a processor chip, and a memory chip stacked on the processor chip with bumps and including a memory cell unit and a memory logic unit. The bumps are arranged on the memory logic unit. An address and data are transferred between the processor chip and the memory chip by use of shared bumps of the bumps.

16 Claims, 9 Drawing Sheets

(56) References Cited

U.S. PATENT DOCUMENTS

2013/0021866 A1* 1/2013 Lee ................... H01L 25/0657
                                                    365/230.01
2013/0153899 A1* 6/2013 Wada et al. ................... 257/48

FOREIGN PATENT DOCUMENTS

| JP | 2011-86330 | 4/2011 |
| WO | WO 2007/116485 A1 | 10/2007 |
| WO | WO 2011/112523 A2 | 9/2011 |

OTHER PUBLICATIONS

First Office Action issued by the Japanese Patent Office on Sep. 3, 2013, for Japanese Patent Application No. 2012-226162, and English-language translation thereof.

* cited by examiner

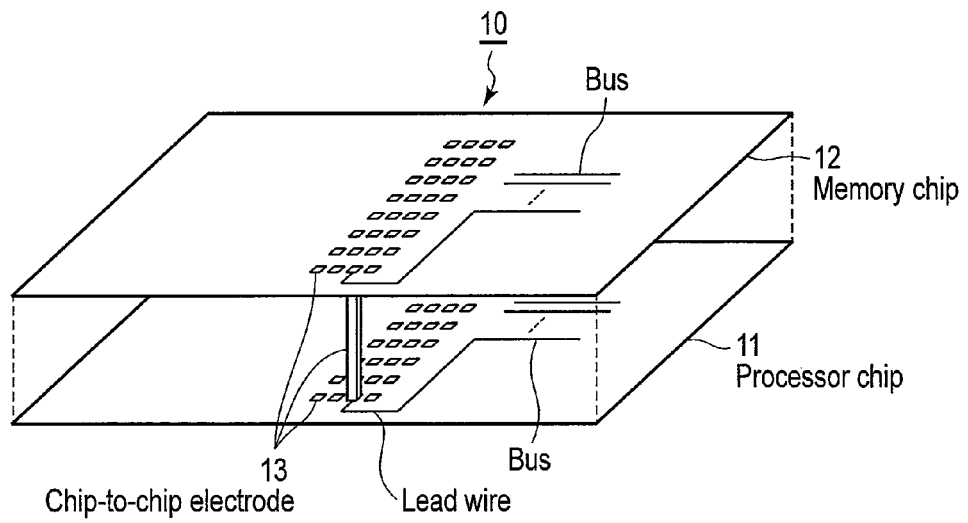
F I G. 1
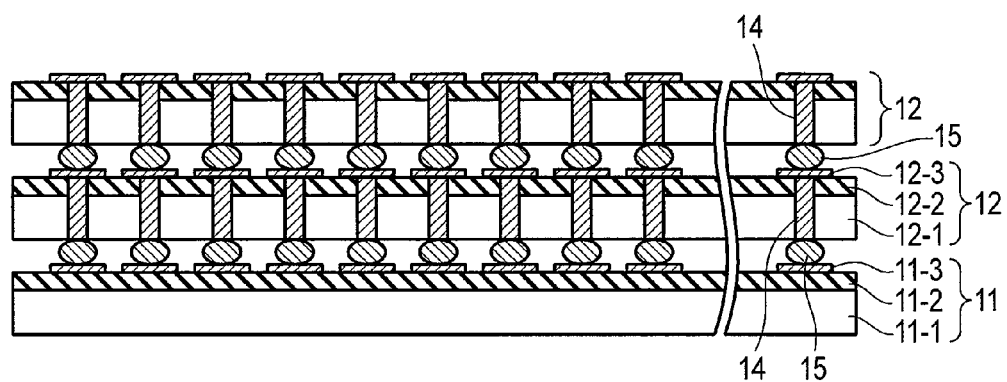
F I G. 2

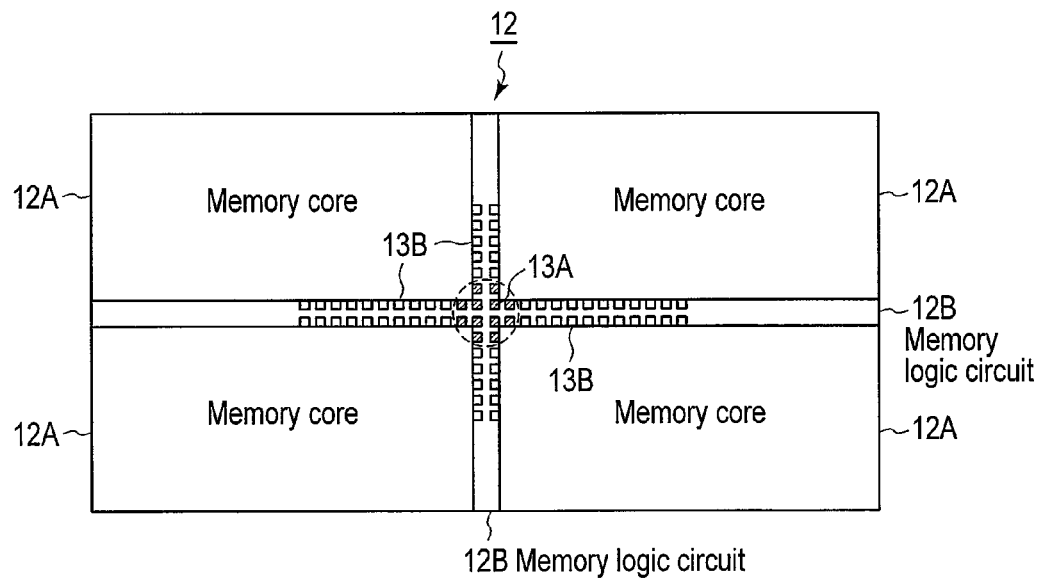
F I G. 5
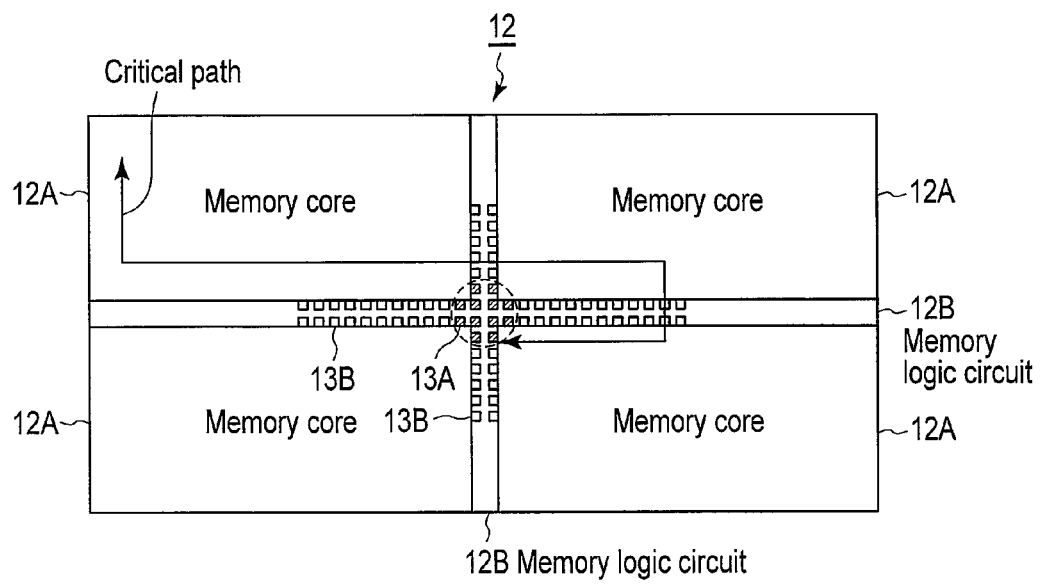
F I G. 6

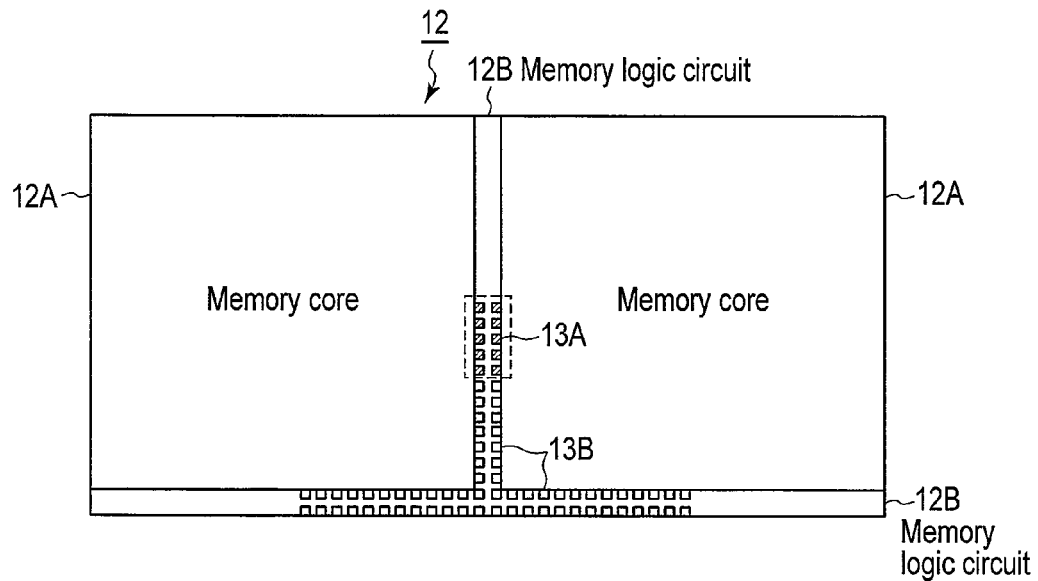
F I G. 7
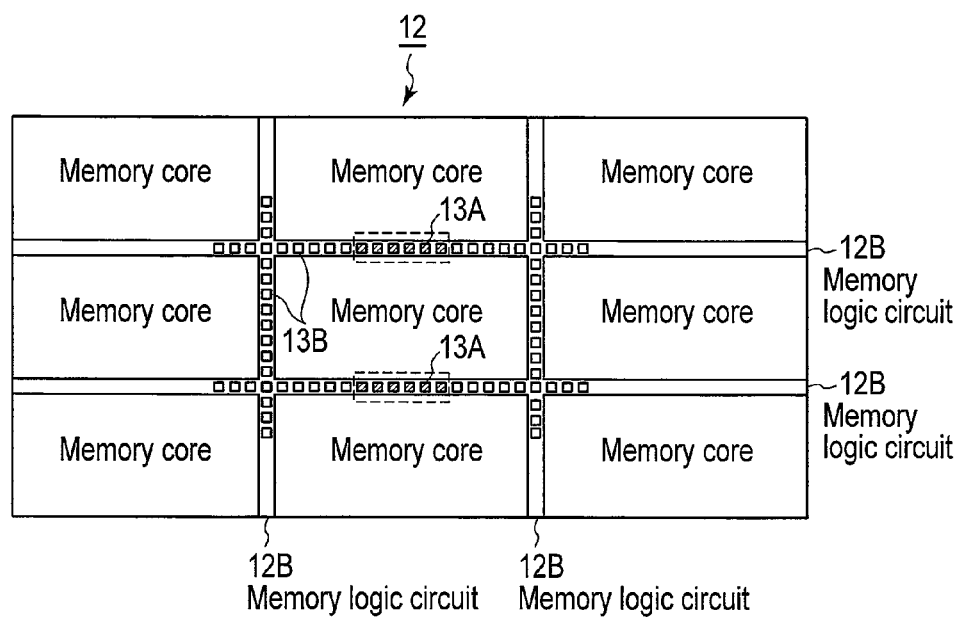
F I G. 8

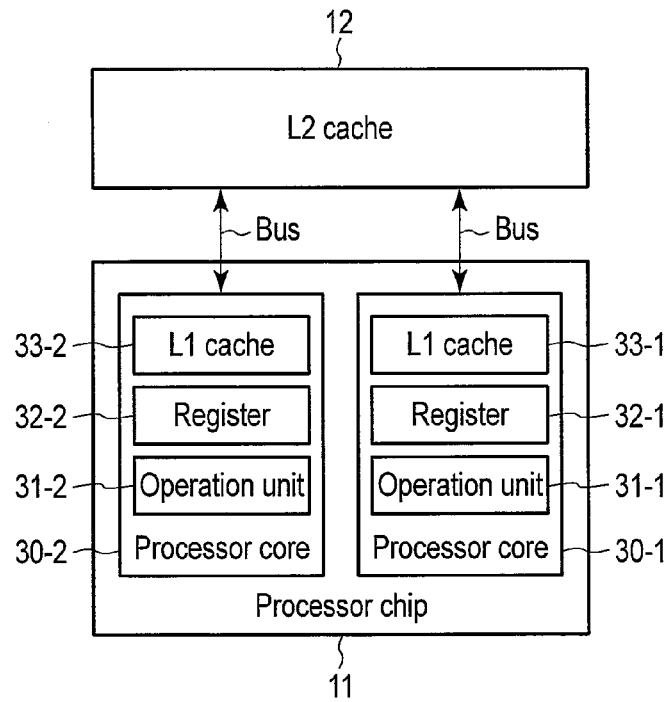
F I G. 9
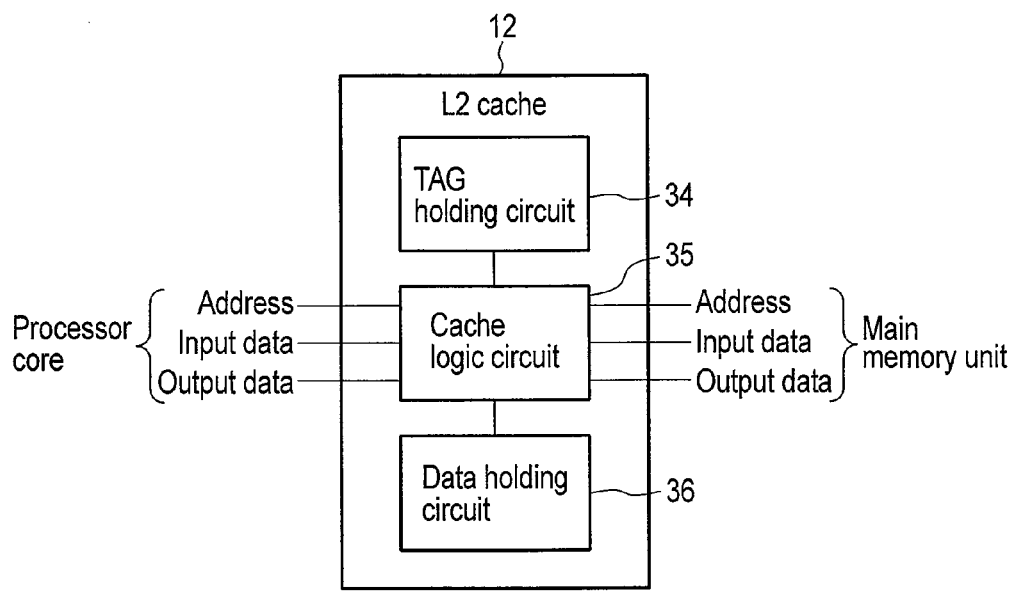
F I G. 10

SEMICONDUCTOR DEVICE HAVING STACKED CHIPS

CROSS-REFERENCE TO RELATED APPLICATIONS

This application is based upon and claims the benefit of priority from Japanese Patent Application No. 2012-226162, filed Oct. 11, 2012, the entire contents of which are incorporated herein by reference.

FIELD

Embodiments described herein relate generally to a semiconductor device.

BACKGROUND

Improvement of the performance of LSIs by scaling becomes more difficult as the process generation proceeds. Further, a rapid increase in the manufacturing cost becomes a serious problem as the LSI is miniaturized. In such a condition, attempts are actively made to enhance the performance of LSIs by stacking semiconductor chips by use of chip-to-chip electrodes such as micro-bumps, through-silicon vias (TSVs) and the like. Among them, the chip structure which is made by stacking a memory chip on a processor chip is considered desirable and is positively developed.

When data is transferred between the processor chip and the memory chip, it is necessary to transfer a control signal, address, input/output data and the like from the bus of the processor chip to the bus of the memory chip via the chip-to-chip electrodes. That is, it is necessary to provide a plurality of chip-to-chip electrodes corresponding in number to the number of signals such as a control signal, address signal, data signal and the like. Generally, electrode pitch is approximately 100 to 1000 times larger than the interconnect pitch of the buses.

Therefore, since a large number of electrodes corresponding in number to the number of signals are used when the processor chip and the memory chip are stacked, a problem that the chip area is increased occurs. Further, a long interconnect is required to connect the bus to the chip-to-chip electrode and a problem that the signal is delayed and the power consumption is increased due to the long interconnect occurs.

BRIEF DESCRIPTION OF THE DRAWINGS

FIG. 1 is a schematic view of a stacked semiconductor chip according to one embodiment;

FIG. 2 is a cross-sectional view of the stacked semiconductor chip;

FIG. 5 is a layout diagram of a memory chip;

FIG. 6 is a diagram for illustrating a critical path of the memory chip;

FIG. 7 is a layout diagram of a memory chip of another configuration example;

FIG. 8 is a layout diagram of a memory chip of still another configuration example;

FIG. 9 is a block diagram of a processor chip;

FIG. 10 is a block diagram of a secondary cache;

DETAILED DESCRIPTION

Figure 3:
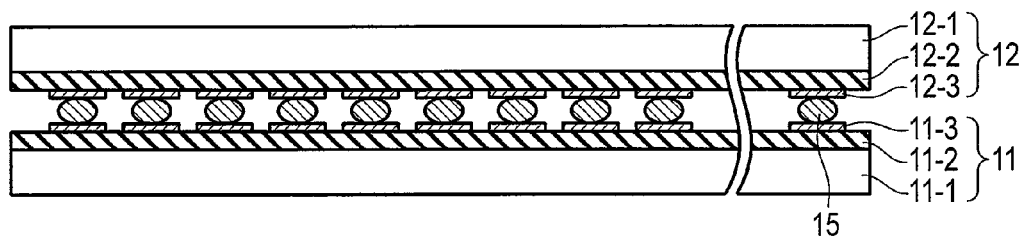
FIG. 3 is a cross-sectional view of a stacked semiconductor chip of another configuration example.

In general, according to one embodiment, there is provided a semiconductor device comprising:

a processor chip; and a memory chip stacked on the processor chip with bumps and including a memory cell unit and a memory logic unit, wherein the bumps are arranged on the memory logic unit, and an address and data are transferred between the processor chip and the memory chip by use of shared bumps of the bumps.

Embodiments will be explained below with reference to the accompanying drawings. Note that these drawings are exemplary or conceptual, so the dimensions and ratios of each drawing are not necessarily the same as real dimensions and ratios. Even if the same portions are described between different drawings, the portions may be described by the different dimensions and ratios with each other. Several embodiments to be described below represent examples of apparatuses and methods for embodying the technical idea of the present invention, and the technical idea of the present invention is not specified by the shapes, structures, and layouts of the constituent parts. Note that in the following explanation, the same reference numerals denote elements having the same functions and arrangements, and a repetitive explanation will be made only when necessary.

[1. Configuration of Stacked Chip]

FIG. 1 is a schematic view of a stacked semiconductor chip 10 according to one embodiment. The stacked semiconductor chip 10 configures a semiconductor integrated circuit and is configured by stacking a plurality of semiconductor chips. In this embodiment, the plural stacked semiconductor chips include a processor chip 11 and memory chip 12. The concrete configurations of the processor chip 11 and memory chip 12 are described later.

The processor chip 11 and memory chip 12 are electrically connected via a plurality of chip-to-chip electrodes 13 formed to extend in a stacking direction. In FIG. 1, one chip-to-chip electrode 13 that extends in the stacking direction is shown as an example in order to avoid the drawing from becoming complicated, but the other chip-to-chip electrodes 13 are also formed to extend in the stacking direction to electrically connect the processor chip 11 with the memory chip 12. The chip-to-chip electrode 13 is electrically connected to a signal line such as a bus formed on each of the processor chip 11 and memory chip 12 via interconnects. The chip-to-chip electrode 13 is formed of a through electrode (through-silicon via [TSV]) that penetrates the semiconductor chip, electrode bump, micro-bump and the like.

FIG. 2 is a cross-sectional view of the stacked semiconductor chip 10. The semiconductor chip (for example, the processor chip) 11 includes a semiconductor substrate 11-1, a multi-layered interconnect layer 11-2 formed on the semiconductor substrate 11-1 and a plurality of electrode pads 11-3 formed on the multi-layered interconnect layer 11-2. Likewise, the semiconductor chip (for example, the memory chip) 12 includes a semiconductor substrate 12-1, a multi-layered interconnect layer 12-2 formed on the semiconductor substrate 12-1 and a plurality of electrode pads 12-3 formed on the multi-layered interconnect layer 12-2. Further, through electrodes 14 are formed in the semiconductor substrate 12-1 and multi-layered interconnect layer 12-2 to penetrate them and each through electrode 14 electrically connects the electrode pad 12-3 on the front surface side of the semiconductor substrate 12-1 and an electrode pad (not shown) on the back surface side of the semiconductor substrate 12-1.

Conductive micro-bumps 15 are respectively provided between the electrode pads 11-3 and the through electrodes 14 and the processor chip 11 and memory chip 12 are electrically connected via the plural micro-bumps 15. The chip-to-chip electrode 13 shown in FIG. 1 is formed of the through electrode 14, micro-bumps 15 and electrode pads 11-3 and 12-3 shown in FIG. 2. As shown in FIG. 2, for example, still another semiconductor chip (for example, a memory chip) 12 is stacked on the memory chip 12. The number of stacked semiconductor chips can be freely set.

The shape of the TSV becomes different according to a manufacturing method of the TSV (through electrode). In the case of a via-middle type TSV, the TSV penetrates a semiconductor substrate (silicon substrate) but does not penetrate an interconnect layer. Therefore, in an area in which the TSV is formed, transistors cannot be arranged but interconnects can be arranged. In the case of a via-last type TSV, the TSV penetrates a semiconductor substrate and interconnect layer. Therefore, in an area in which the TSV is formed, transistors and interconnects cannot be arranged.

Further, the stacked semiconductor chip 10 may be formed to connect two semiconductor chips by use of flip-chip method. FIG. 3 is a cross-sectional view of a stacked semiconductor chip 10 of another configuration example.

As shown in FIG. 3, the front surface (the surface on which the multi-layered interconnect layer 11-2 is formed) of the processor chip 11 and the front surface (the surface on which the multi-layered interconnect layer 12-2 is formed) of the memory chip 12 are arranged to face each other and the memory chip 12 is mounted on the processor chip 11 with the plural micro-bumps 15 disposed therebetween. Each micro-bump 15 is electrically connected to the electrode pad 11-3 of the processor 11 and the electrode pad 12-3 of the memory chip 12.

Figure 4:
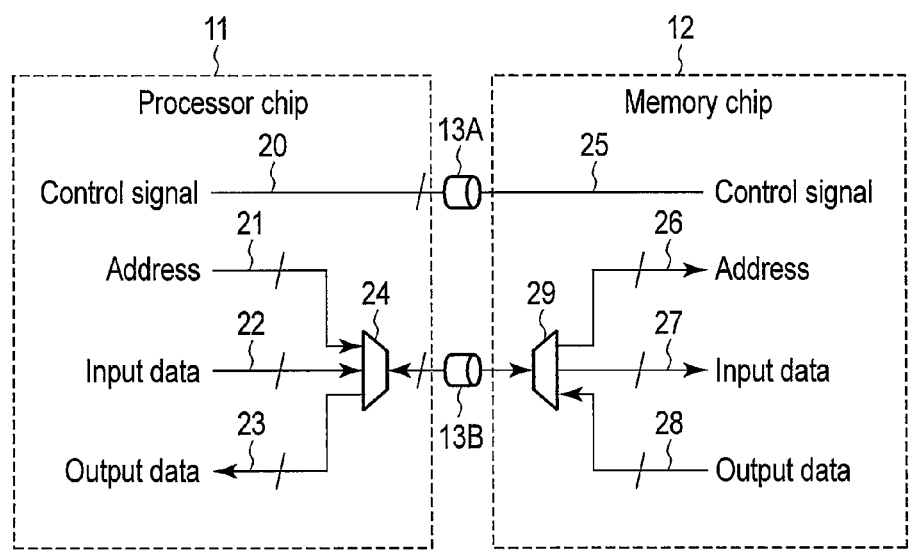
FIG. 4 is a circuit diagram of the stacked semiconductor chip.

FIG. 4 is a circuit diagram of the stacked semiconductor chip 10. As shown in FIG. 4, for example, a control signal, address, input data, output data and the like are transferred between the processor chip 11 and the memory chip 12.

The processor chip 11 includes a plurality of control signal lines 20 for transferring control signals, an address bus 21 for transferring an address, an input data bus 22 for transferring input data, an output data bus 23 for transferring output data and a multiplexer 24. The address bus 21, input data bus 22 and output data bus 23 are connected to the input terminals of the multiplexer 24. The multiplexer 24 selects the address bus 21, input data bus 22 or output data bus 23 based on a select signal.

The memory chip 12 includes a plurality of control signal lines 25, address bus 26, input data bus 27, output data bus 28 and multiplexer 29. The address bus 26, input data bus 27 and output data bus 28 are connected to the input terminals of the multiplexer 29. The multiplexer 29 selects the address bus 26, input data bus 27 or output data bus 28 based on a select signal.

The control signal lines 20 of the processor chip 11 and the control signal lines 25 of the memory chip 12 are electrically connected via a plurality of chip-to-chip electrodes 13A. That is, control signals are transferred between the processor chip 11 and the memory chip 12 via the dedicated chip-to-chip electrodes 13A. The output terminals of the multiplexer 24 of the processor chip 11 and the output terminals of the multiplexer 29 of the memory chip 12 are electrically connected via a plurality of chip-to-chip electrodes 13B. Each of the multiplexers 24 and 29 can control the connection between the chip-to-chip electrode and a selected one of the buses.

As described above, in this embodiment, control signals are transferred via the individual chip-to-chip electrodes and addresses and data are transferred by using shared chip-to-chip electrodes and switching the buses by use of the multiplexers. The number of chip-to-chip electrodes 13 can be markedly reduced by transferring the address and data by use of the shared chip-to-chip electrodes.

FIG. 5 is a layout diagram of the memory chip 12. The memory chip 12 includes memory cores 12A and memory logic circuit 12B. The memory core 12A includes a memory cell array that stores data and a circuit portion (configured by an analog circuit) for writing data to the memory cell array and reading data from the memory cell array. The memory logic circuit 12B is a circuit for controlling the operation (write operation, read operation, erase operation and the like) of the memory core 12A and does logical operations. The memory logic circuit 12B includes a buffer, decoder, control circuit and the like.

As shown in FIG. 5, the memory logic circuit 12B is arranged in a cross-shaped region that is formed in a crisscross form at the central portion (for example, at the center) of the memory chip 12. In other words, the memory logic circuit 12B is arranged in a cross-shaped region including first and second lines that cross at the central portion of the chip. The portion at which the first and second lines cross is not limited to the center of the memory chip 12 and may be deviated from the center of the memory chip 12 depending on the sizes of the four memory cores 12A.

The plural chip-to-chip electrodes 13 (including the chip-to-chip electrodes 13A and 13B) provided in the memory chip 12 are arranged in the cross-shaped region of the memory logic circuit 12B. If the chip-to-chip electrodes 13 are arranged in the memory cell array, the characteristic of the memory cell changes and the performance and manufacturing yield are lowered. This is because an analog operation is required at the read operation of the memory. To solve the above problem, the chip-to-chip electrodes 13 are arranged in the cross-shaped region of the memory logic circuit 12B. If the chip-to-chip electrodes 13 are arranged in the memory logic circuit 12B, the signal is delayed only slightly and there is small influence for the performance and manufacturing yield.

Further, as shown in FIG. 5, the chip-to-chip electrodes 13A used for control signal lines (the hatched chip-to-chip electrodes in FIG. 5) are arranged in the memory logic circuit 12B and in a portion near the central portion of the memory chip 12 to be set at constant distances from memory core portions that are formed on the peripheral portions (end portions) of the chip. As a result, the signal delay and power consumption can be suppressed. The chip-to-chip electrodes 13B used for wires (including the buses) other than the control signal lines are arranged in the memory logic circuit 12B and around the chip-to-chip electrodes 13A.

FIG. 6 is a diagram for illustrating a critical path of the memory chip 12. The critical path is the longest path among the signal paths and is used as a reference for determining and comparing the signal delay of the circuit. In this embodiment, the critical path of the memory chip 12 can be made short in comparison with a case wherein the chip-to-chip electrodes used for the control signal lines are arranged on the end portions of the chip. As a result, the signal delay and power consumption can be suppressed.

FIG. 7 is a layout diagram of a memory chip 12 of another configuration example. Part of the memory logic circuit 12B may be arranged along the side of the chip. In other words, the memory logic circuit 12B is arranged in a T-shaped region formed of a first line passing through the central portion of the memory chip 12 and a second line intersecting at right angles with the first line and passing through the end portion of the chip. Further, the chip-to-chip electrodes 13A used for control signal lines are arranged in the memory logic circuit 12B and in a portion near the central portion of the memory chip 12.

FIG. 8 is a layout diagram of a memory chip 12 of still another configuration example. The memory logic circuit 12B may be arranged in a lattice region (grid region) formed of a plurality of first lines that divide the memory chip 12 in a vertical direction and a plurality of second lines that divide the chip in a lateral direction. In the case of the configuration example of FIG. 8, the chip-to-chip electrodes 13A used for control signal lines are arranged in the memory logic circuit 12B and in a portion near the central portion of the memory chip 12.

The layout of the chip-to-chip electrodes 13 arranged in the processor chip 11 is formed to match the layout of the chip-to-chip electrodes 13 arranged in the memory chip 12. In the layout of the processor chip 11, it is desirable to arrange and wire the signal lines not to influence the critical path according to the arrangement of the chip-to-chip electrodes determined to match the layout of the memory chip 11.

In FIGS. 5, 7 and 8, the number of chip-to-chip electrodes is given as one example. The number can be changed from that shown in the drawing depending on the width of the address bus and the width of the data bus, and in this case, this can be realized like the above case.

[2. Configuration of Processor Chip]

Next, one example of the configuration of the processor chip 11 is explained. FIG. 9 is a block diagram of the processor chip 11. For example, the processor chip 11 includes two processor cores 30-1 and 30-2. The processor cores 30-1 and 30-2 respectively include operation units 31-1 and 31-2, registers 32-1 and 32-2, primary cache memories (L1 caches) 33-1 and 33-2 and the like. In the following explanation, if the processor cores 30-1 and 30-2 are not required to be distinguished from each other, they are expressed by omitting the branched numbers and the thus expressed core indicates each of the processor cores. This applies to the other reference symbols with branched numbers.

A secondary cache memory (L2 cache) is connected to the processor core 30 via bus. As the L2 cache, the memory chip 12 described before is used. For example, as shown in FIG. 9, a portion up to the L1 caches is dealt with in the processor core unit, and the L2 cache and a portion following the L2 cache is commonly used by the plural processor cores. The number of hierarchies of caches can be freely set.

The operation unit 31 interprets and executes an instruction and executes a preset program. At this time, the operation unit 31 performs data writing and reading operation with respect to the L1 caches 33, L2 cache 12 and main memory unit (not shown). The operation unit 31 first accesses the L1 cache 33 to read data, and if desired data is not present in the L1 cache 33, the operation unit 31 accesses the L2 cache 12 to read data. Further, if desired data is not present in the L2 cache 12, the operation unit 31 accesses the main memory unit to read data. Thus, an information processing device (stacked semiconductor chip) 10 including the L1 caches 33 and L2 cache 12 can realize the high-speed data read process.

[3. Configuration of Memory Chip]

Next, one example of the configuration of the memory chip 12 is explained. As described before, the memory chip 12 configures the L2 cache. FIG. 10 is a block diagram of the L2 cache 12. The L2 cache 12 transfers data between the processor core 30 and the main memory unit. The L2 cache 12 includes a TAG holding circuit 34, cache logic circuit 35 and data holding circuit 36.

The TAG holding circuit 34 and data holding circuit 36 are respectively composed by memory circuits. The data holding circuit 36 stores cache data. The TAG holding circuit 34 stores address of cache data. The cache line stores one data or plural data items of the minimum unit that are transferred between the processor core and the cache. The data holding circuit 36 stores data in the cache line. That is, each cache line contains plural data items of the minimum unit in the data holding circuit 36. The tag is address information of data corresponding thereto.

The cache logic circuit 35 is a circuit that determines whether or not data required by the processor core 30 is present in the L2 cache by use of the tag. When the tag is hit, the cache logic circuit 35 transmits data corresponding to the tag to the processor core 30.

If the memory chip 12 is used as the L2 cache, the memory logic circuit 12B of FIG. 5 corresponds to the buffer and decoder included in the TAG holding circuit 34 and data holding circuit 36 and the cache logic circuit 35 and the memory core 12A corresponds to the other portion.

In this embodiment, the memory chip (L2 cache) 12 is made by a magnetic random access memory (MRAM), for example. The MRAM uses a magnetic tunnel junction (MTJ) element utilizing the magnetoresistive effect due to which the resistance varies depending on the magnetization direction as a memory element. The more specific circuit configuration obtained when the MRAM is used as the memory chip 12 is explained below.

Figure 11:
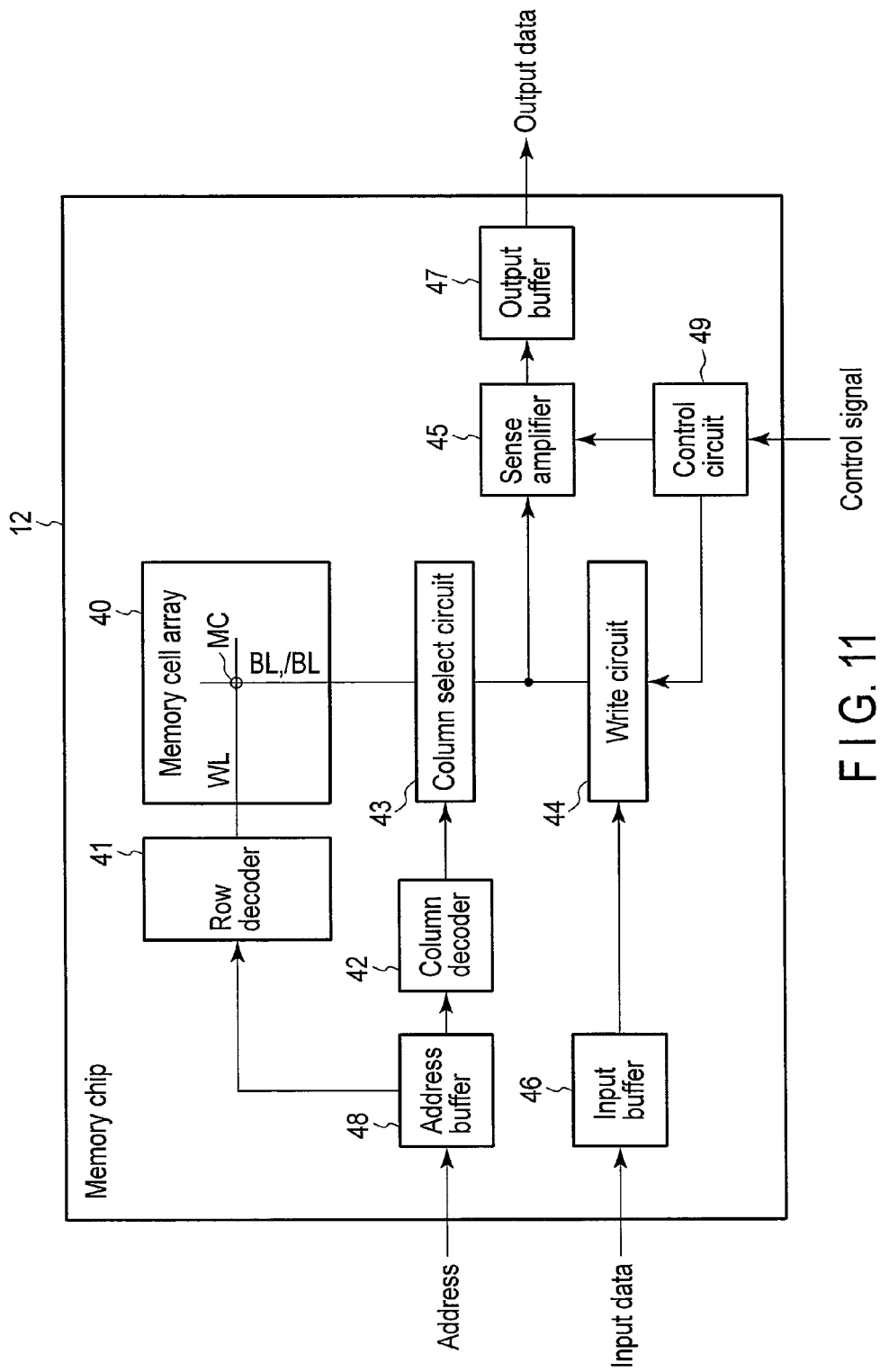
FIG. 11 is a block diagram of an MRAM.

FIG. 11 is a block diagram of the MRAM. The MRAM includes a memory cell array 40, row decoder 41, column decoder 42, column select circuit 43, write circuit 44, sense amplifier 45, input buffer 46, output buffer 47, address buffer 48 and control circuit 49.

The memory cell array 40 has a plurality of memory cells MC arranged in a matrix form. In the memory cell array 40, a plurality of word lines WL extending in the row direction and a plurality of bit line pairs BL, /BL extending in the column direction are arranged. Each memory cell MC is connected to one word line WL and one bit line pair BL, /BL.

The row decoder 41 is connected to plural word lines WL. The row decoder 41 selects one of plural word lines WL based on a row address.

The column select circuit 43 is connected to plural bit line pairs BL, /BL. The column select circuit 43 selects one of plural bit line pairs BL, /BL based on a column select signal. The column decoder 42 generates a column select signal based on a column address and supplies the column select signal to the column select circuit 43. The address buffer 48 temporarily stores an address supplied from the outside, supplies a row address to the row decoder 41 and supplies a column address to the column decoder 42.

The write circuit 44 supplies a write current to the selected bit line pair BL, /BL during the data write operation and write data to selected memory cell MC. The input buffer 46 temporarily holds input data from the outside and supplies the input data to the write circuit 44.

The sense amplifier 45 senses a cell current flowing in selected bit line pair BL, /BL to read data stored in selected memory cell MC at the data read time. The output buffer 47 temporarily holds data read by means of the sense amplifier 45 and outputs output data to the outside. The control circuit 49 controls the respective circuits in the MRAM to control the data write operation, read operation and erase operation.

If the memory chip 12 is configured by an MRAM, the memory logic circuit 12B of FIG. 5 corresponds to the row decoder 41, column decoder 42, column select circuit 43, input buffer 46, output buffer 47, address buffer 48 and control circuit 49 and the memory core 12A corresponds to the other portion.

Figure 12:
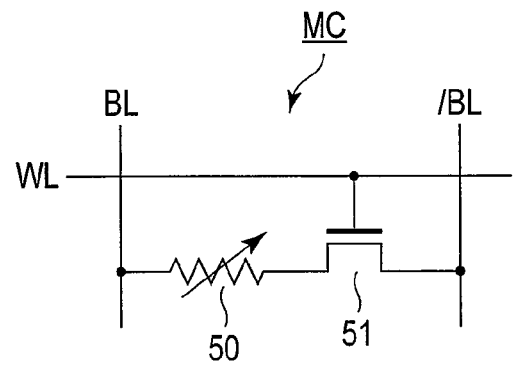
FIG. 12 is a circuit diagram of a memory cell.

FIG. 12 is a circuit diagram of memory cell MC. Memory cell MC includes an MTJ element (magnetoresistive element) 50 and select transistor 51. The select transistor 51 is configured by an N-channel MOSFET, for example.

One end of the MTJ element 50 is connected to bit line BL and the other end thereof is connected to the drain of the select transistor 51. The gate of the select transistor 51 is connected to word line WL and the source thereof is connected to bit line /BL.

Figure 13:
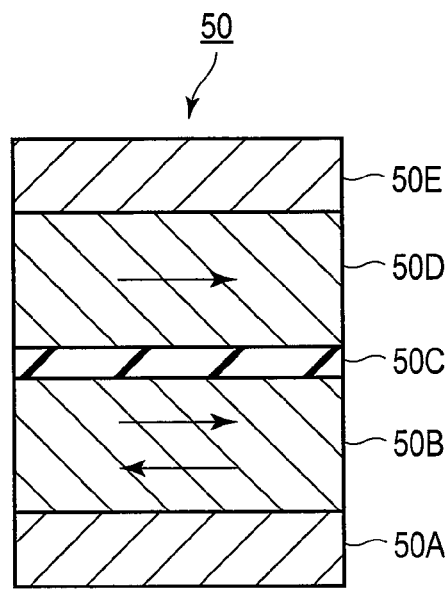
FIG. 13 is a cross-sectional view of an MTJ element.

FIG. 13 is a cross-sectional view of the MTJ element 50. The MTJ element 50 is made by sequentially stacking a lower electrode 50A, memory layer (also called a free layer) 50B, nonmagnetic layer (tunnel barrier layer) 50C, reference layer (also called a fixed layer) 50D and upper electrode 50E. The order of stacking may be reversed.

The memory layer 50B and reference layer 50D are each formed of a ferromagnetic material. As the tunnel barrier layer 50C, an insulating film of MgO, for example, is used.

The memory layer 50B and reference layer 50D in the FIG. 13 have magnetic anisotropy in an in-plane direction and the directions of easy magnetization thereof are set in the in-plane direction. The magnetization directions of the memory layer 50B and reference layer 50D may be set in a direction perpendicular to the film surface.

The magnetization direction of the memory layer 50B is variable (reversed). The magnetization direction of the reference layer 50D is invariable (fixed). The reference layer 50D is set to have magnetic anisotropic energy that is sufficiently higher than that of the memory layer 50B. The magnetic anisotropy can be set by adjusting the film composition and film thickness. Thus, the magnetization inversion current of the memory layer 50B is made small and the magnetization inversion current of the reference layer 50D is made larger than that of the memory layer 50B. As a result, an MTJ element 50 including the memory layer 50B whose magnetization direction is variable and the reference layer 50D whose magnetization direction is invariable with respect to a preset write current can be realized.

In this embodiment, a spin-transfer torque writing method in which a write current is directly passed through the MTJ element 50 and the magnetization state of the MTJ element 50 is controlled according to the write current is used. The MTJ element 50 can take one of the low-resistance state and high-resistance state according to whether the correlation of magnetizations of the memory layer 50B and reference layer 50D is parallel or anti-parallel.

If a write current from the memory layer 50B to the reference layer 50D is passed through the MTJ element 50, the correlation of magnetizations of the memory layer 50B and reference layer 50D becomes parallel. In the case of the parallel state, the resistance of the MTJ element 50 becomes the lowest and the MTJ element 50 is set in the low-resistance state. The low-resistance state of the MTJ element 50 is defined as data "0", for example.

On the other hand, if a write current from the reference layer 50D to the memory layer 50B is passed through the MTJ element 50, the correlation of magnetizations of the memory layer 50B and reference layer 50D becomes anti-parallel. In the case of the anti-parallel state, the resistance of the MTJ element 50 becomes the highest and the MTJ element 50 is set in the high-resistance state. The high-resistance state of the MTJ element 50 is defined as data "1", for example.

Thus, the MTJ element 50 can be used as a memory element that can store one-bit data (binary data). Allocation of the resistance state of the MTJ element 50 and data can be freely set.

[4. Operation]

Figure 14:
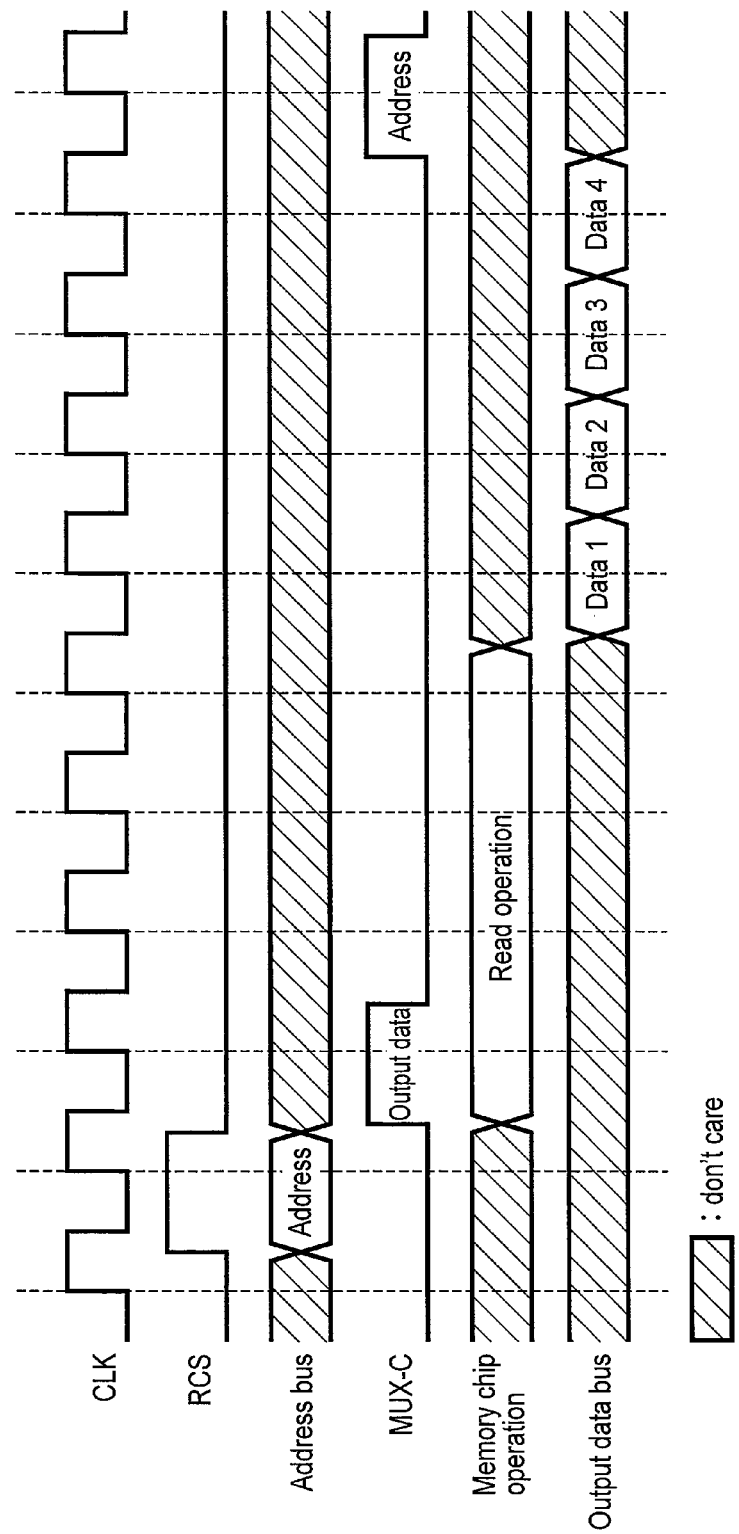
FIG. 14 is a timing chart for illustrating the read operation of the stacked semiconductor chip.

The operation of the stacked semiconductor chip 10 configured as described above is explained. First, the read operation of the stacked semiconductor chip 10 is explained. FIG. 14 is a timing chart for illustrating the read operation of the stacked semiconductor chip 10. For example, the processor chip 11 transmits clock CLK to the memory chip 12. A signal line used for transmitting clock CLK is included in the control signal lines.

In the initial state, the address buses 21 and 26 are connected to the chip-to-chip electrodes 13B of FIG. 4. The processor chip 11 supplies read signal RCS to the memory chip 12 via the control signal lines 20, chip-to-chip electrodes 13A and control signal lines 25 and supplies an address to the memory chip 12 via the address bus 21, chip-to-chip electrodes 13B and address bus 26. After the address is transferred, the processor core 30 supplies select signal MUX-C used for switching from the address bus to the output data bus to the multiplexers 24 and 29. As a result, the multiplexers 24 and 29 respectively select the output data buses 23 and 28 and the output data bus 23 is connected to the output data bus 28 via the chip-to-chip electrodes 13B.

The memory chip 12 performs the read operation based on read signal RCS and address. When the read operation of the memory chip 12 is completed, the memory chip 12 sequentially transfers output data to the processor chip 11 via the output data bus. In FIG. 14, the operation of transferring output data in four divided cycles is shown as one example.

When the transfer operation of the output data is completed, the processor core 30 supplies select signal MUX-C used for switching from the output data bus to the address bus to the multiplexers 24 and 29. As a result, the multiplexers 24 and 29 respectively select the address buses 21 and 26 and the address bus 21 is connected to the address bus 26 via the chip-to-chip electrodes 13B. That is, the bus connection is returned to the initial state and the preparation for execution of a next read instruction or write instruction is completed.

The transfer cycle of output data is generally determined based on the bus width and the bit number of read data of the memory. The transfer cycle number can be freely set and is not limited to four. Generally, the read operation of the memory requires a plurality of clock cycles. That is, the connection of the buses of the multiplexer can be switched during the read operation by the memory chip 12. Therefore, even if the chip-to-chip electrodes 13B is commonly used in transferring the address and output data as in this embodiment, the number of read cycles is not increased. Since the critical path is made short by applying the layout shown in FIG. 5 to FIG. 8, the read time of the memory chip 12 can be reduced and the whole signal delay amount can be reduced.

Figure 15:
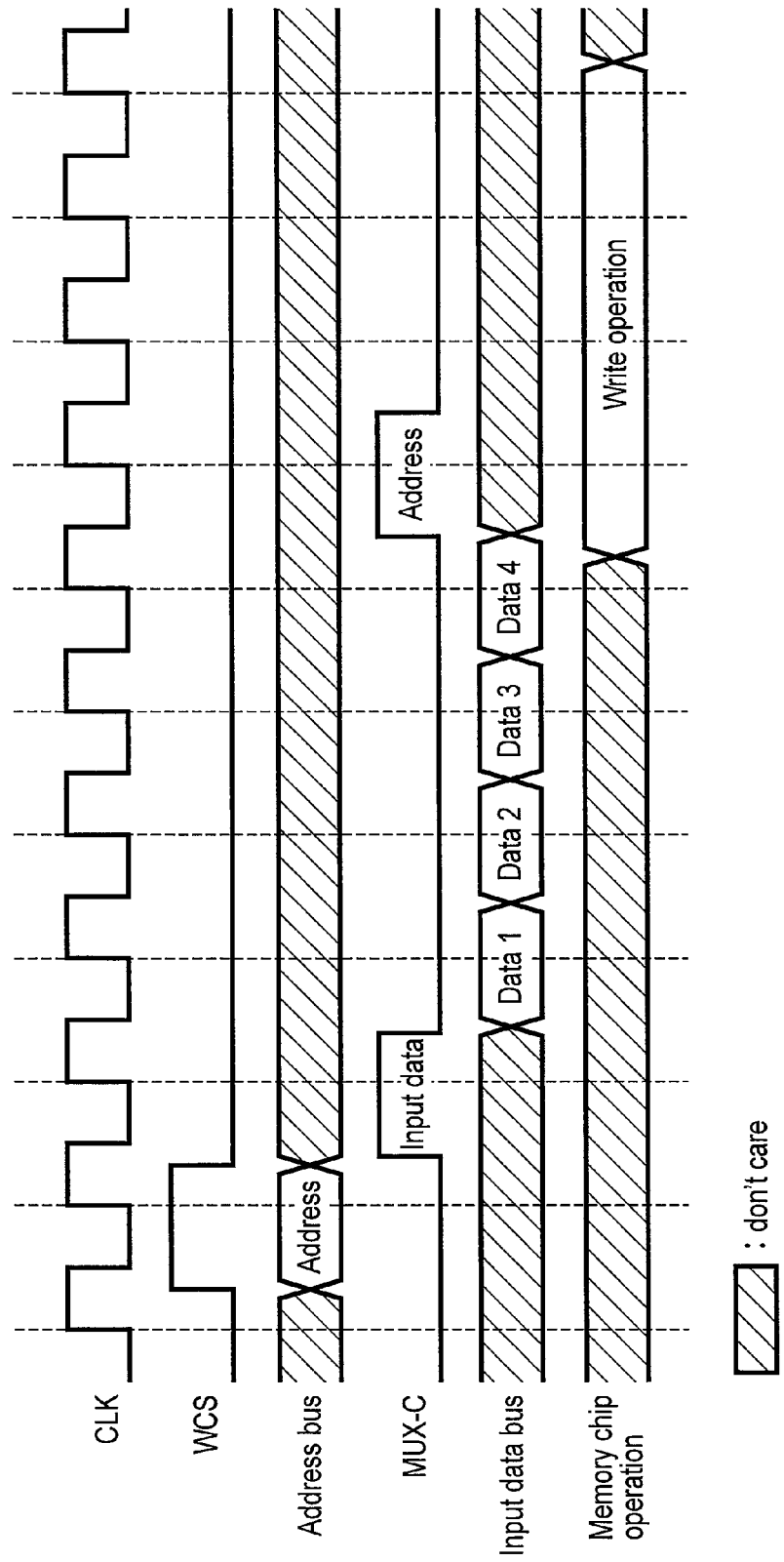
FIG. 15 is a timing chart for illustrating the write operation of the stacked semiconductor chip.

Next, the write operation of the stacked semiconductor chip 10 is explained. FIG. 15 is a timing chart for illustrating the write operation of the stacked semiconductor chip 10.

In the initial state, the address buses 21 and 26 are connected to the chip-to-chip electrodes 13B of FIG. 4. The processor chip 11 supplies write signal WCS to the memory chip 12 via the control signal lines 20, chip-to-chip electrodes 13A and control signal lines 25 and supplies an address to the memory chip 12 via the address bus 21, chip-to-chip electrodes 13B and address bus 26. After the address is transferred, the processor core 30 supplies select signal MUX-C used for switching from the address bus to the input data bus to the multiplexers 24 and 29. As a result, the multiplexers 24 and 29 respectively select the input data buses 22, 27 and the input data bus 22 is connected to the input data bus 27 via the chip-to-chip electrodes 13B.

When the switching operation from the address bus to the input data bus is completed, the processor chip 11 sequentially transfers input data to the memory chip 12 via the input data bus. In FIG. 15, the operation of transferring input data in four divided cycles is shown as one example. The transfer cycle number can be freely set and is not limited to four.

When the transfer operation of the input data is completed, the processor core 30 supplies select signal MUX-C used for switching from the input data bus to the address bus to the multiplexers 24 and 29. As a result, the multiplexers 24 and 29 respectively select the address buses 21 and 26 and the address bus 21 is connected to the address bus 26 via the chip-to-chip electrodes 13B. That is, the bus connection is returned to the initial state and the preparation for execution of a next read instruction or write instruction is completed. The memory chip 12 performs the write operation by use of the address and input data.

At the write operation of the memory, delay increases one clock cycle due to switch the connection of the multiplexer from the address bus to the input data bus. Since the critical path is made short by applying the layout shown in FIG. 5 to FIG. 8, the time required for the write operation of the memory chip 12 can be reduced. When the signal delay reduced by making short the critical path exceeds one clock, the write time of the memory chip 12 can be reduced.

[5. Effect]

As described above in detail, in this embodiment, the stacked semiconductor chip (semiconductor device) 10 includes the processor chip 11 and the memory chip 12 mounted on the processor chip 11 with the plural bumps 15 disposed therebetween. The memory chip 12 includes the memory core (memory cell unit) 12A and memory logic circuit (memory logic unit) 12B. The memory logic circuit 12B is arranged in the cross-shaped region that makes a crossing at the central portion of the memory chip 12 and the plural bumps 15 are arranged on the memory logic circuits 12B. Further, the address and data are transferred between the processor chip 11 and the memory chip 12 via the common bumps. Additionally, the control signal is transferred between the processor chip 11 and the memory chip 12 by use of the dedicated bump and the bump for the control signal is arranged near the central portion of the memory chip 12.

Therefore, according to this embodiment, since the number of bumps can be markedly reduced, the chip area can be reduced. Further, since the critical path can be made short, the signal delay and power consumption can be reduced. As a result, the stacked semiconductor chip 10 capable of performing the high-speed operation can be realized. In this embodiment, the effect of reducing the chip area becomes more significant as the width of the bus for transferring data becomes larger.

In this embodiment, a case wherein the memory chip 12 is made by the MRAM is explained, but this embodiment is not limited to this case and an SRAM may be used as the memory chip 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first chip; and
a second chip stacked with the first chip, the second chip including memory cell units and a memory logic unit between the memory cell units, the memory logic unit including a first line area and a second line area crossing each other to form a crossing area; and
bumps provided between the first chip and the memory logic unit of the second chip such that the bumps overlap the memory logic unit at the crossing area, and for communicating information between the first chip and the second chip.

2. The device of claim 1, wherein
the bumps include a first bump for transferring a control signal and a second bump for transferring an address signal and data.

3. The device of claim 2, wherein
the first bump is provided closer to a central portion of the second chip than the second bump.

4. The device of claim 2, wherein
the first chip includes a first control signal line,
the second chip includes a second control signal line, and
the first control signal line is connected to the second control signal line through the first bump.

5. The device of claim 2, further comprising:
a first electrode that passes through a semiconductor substrate of the second chip and that is connected to the first bump, and
a second electrode that passes through the semiconductor substrate and that is connected to the second bump.

6. The device of claim 2, wherein
the first chip includes a first address bus, a first data bus, and a first multiplexer that selects one of the first address bus and the first data bus,
the second chip includes a second address bus, a second data bus, and a second multiplexer that selects one of the second address bus and the second data bus,
the first address bus selected by the first multiplexer is connected to the second address bus selected by the second multiplexer via the second bump, and the first data bus selected by the first multiplexer is connected to the second data bus selected by the second multiplexer via the second bump.

7. The device of claim 6, wherein the first and second multiplexers select the first and second data buses after the first and second multiplexers select the first and second address buses in read and write operations of the second chip.

8. The device of claim 6, wherein each of the first and second data buses includes an input data bus and an output data bus, the first multiplexer selects one of the input and output data buses, and the second multiplexer selects the other one of the input and output data buses.

9. The device of claim 2, wherein the first chip is a processor chip generating the control signal and the address signal.

10. The device of claim 1, wherein the memory logic unit has an area that comprises first and second line areas crossing each other.

11. The device of claim 1, wherein the memory logic unit is provided at a center portion of the second chip, and the memory cell units are provided symmetrically with respect to the center portion.

12. The device of claim 1, wherein one of the memory cell units is provided at a center portion of the second chip, and the memory logic unit is provided around the center-portion memory cell unit.

13. The device of claim 1, wherein the second chip includes a cache memory.

14. The device of claim 1, wherein the second chip includes an MRAM.

15. The device of claim 1, wherein the memory logic unit includes a buffer and a decoder.

16. The device of claim 1, wherein the memory logic unit includes a cache logic circuit.

* * * * *